(12) United States Patent
Hotozuka et al.

(10) Patent No.: US 6,469,382 B1
(45) Date of Patent: Oct. 22, 2002

(54) SEMICONDUCTOR DEVICE SUBSTRATE AND METHOD OF MANUFACTURING SEMICONDUCTOR DEVICE

(75) Inventors: Kouichi Hotozuka; Yukio Nomura, both of Toyko (JP)

(73) Assignee: NEC Corporation, Tokyo (JP)

( * ) Notice: Subject to any disclaimer, the term of this patent is extended or adjusted under 35 U.S.C. 154(b) by 27 days.

(21) Appl. No.: 09/736,451

(22) Filed: Dec. 15, 2000

(30) Foreign Application Priority Data

Jan. 28, 2000 (JP) ........................................ 2000-020870

(51) Int. Cl.$^7$ ............................................. H01L 23/34
(52) U.S. Cl. ..................... 257/724; 257/687; 257/688; 257/689; 257/700; 257/703; 257/723; 257/729; 257/730; 257/787
(58) Field of Search ................................ 257/687, 700, 257/703, 723, 729, 730, 688, 689, 724, 787

(56) References Cited

U.S. PATENT DOCUMENTS 6,072,122 A * 6/2000 Hosoya ..................... 174/52.4

FOREIGN PATENT DOCUMENTS

| JP | 8-335606 | 12/1996 |
| JP | 10-150127 | 6/1998 |
| JP | 10-294498 | 11/1998 |
| JP | 2867954 | 12/1998 |
| JP | 11-67799 | 3/1999 |

* cited by examiner

*Primary Examiner*—David L. Talbott
*Assistant Examiner*—David A. Zarneke
(74) *Attorney, Agent, or Firm*—Sughrue Mion, PLLC (57) ABSTRACT

A semiconductor device substrate and a method of manufacturing the same by removing variations in resin thickness due to resin flows, warps in the substrate, cracking in the substrate, and foams contained in the resin.

2 Claims, 7 Drawing Sheets

Table 1  The comparation of the data in each examples of bases

| Ex. No. | Base Thickness (mm.) | Film | Removel of foam | Cracked bases (numbers) | Warp in base, uncured (μm) | Warp in base, cured (μm) | Variation of resin thickness (μm) | Max foam dia (mm) | Example |
|---|---|---|---|---|---|---|---|---|---|
| 1 | 0.25 | N | N | 0 | ~30 | 100~140 | 80~140 | ~0.20 | Prior Art |
| 2 | 0.20 | N | N | 1 | ~35 | 150~200 | 90~120 | ~0.25 | Fig. 2A-Fig. 2C |
| 3 | 0.15 | N | N | 4 | ~50 | 200~300 | 80~150 | ~0.22 | |
| 4 | 0.15 | N | N | 0 | ~20 | 20~50 | 90~160 | ~0.5 | Fig. 5 |
| 5 | 0.25 | N | Y | 0 | ~15 | 30~70 | 10~60 | ~0.05 | This invention |
| 6 | 0.20 | N | Y | 0 | ~25 | 30~70 | 20~60 | ~0.08 | |
| 7 | 0.15 | N | Y | 0 | ~20 | 20~60 | 10~50 | ~0.05 | |
| 8 | 0.10 | N | Y | 0 | ~20 | 30~80 | 20~50 | ~0.06 | Fig. 7A-Fig. 7D |
| 9 | 0.15 | N | N | 0 | ~20 | 20~60 | 10~60 | ~0.15 | |
| 10 | 0.15 | Y | Y | 0 | ~20 | 20~80 | 5~20 | ~0.05 | Fig. 8A-Fig. 8D |

* 1. Film N: not exist, Y: exist
2. Removal of Foam N: not done Y: done
3. Total numbers of each examples: 20

United States Patent

SEMICONDUCTOR DEVICE SUBSTRATE AND METHOD OF MANUFACTURING SEMICONDUCTOR DEVICE

BACKGROUND OF THE INVENTION

1. Field of the Invention

The present invention relates to a semiconductor device substrate, and a method of manufacturing the substrate and a semiconductor device.

2. Description of the Related Art

Semiconductor devices are increasingly reduced in size and weight. With a smaller thickness of portable devices in recent years, a smaller thickness is also required in semiconductor devices used therefor.

Figure 1A:
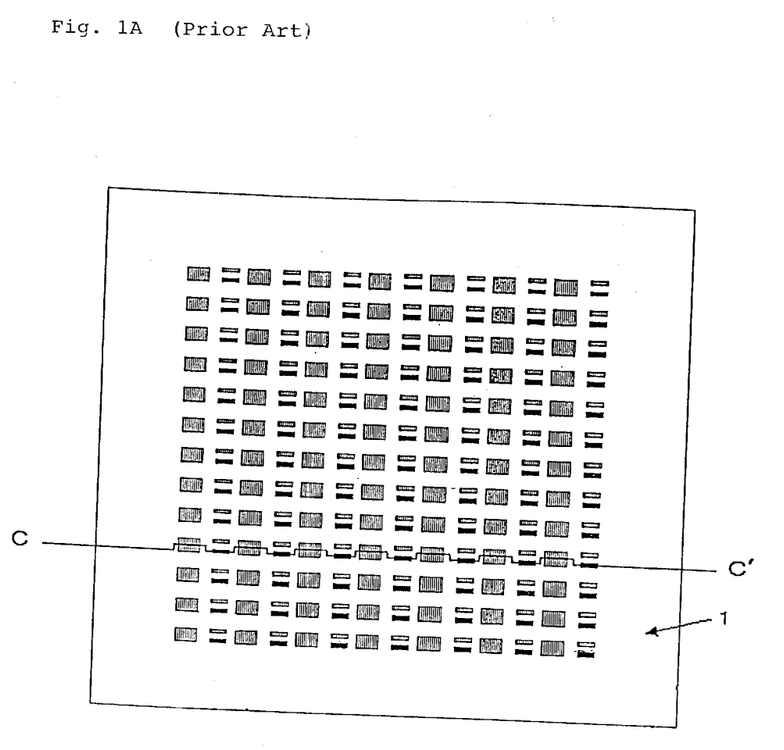
FIG. 1A and FIG. 1B are a top view and a section view of a substrate of a prior art, respectively.
Figure 1B:
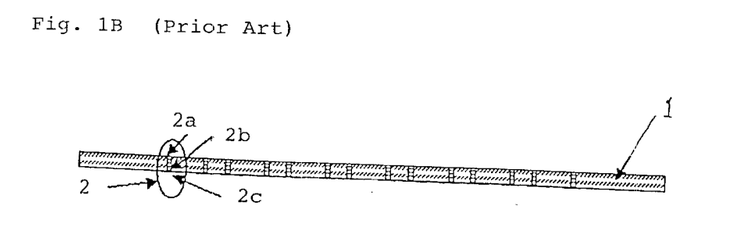
Figure 2A:
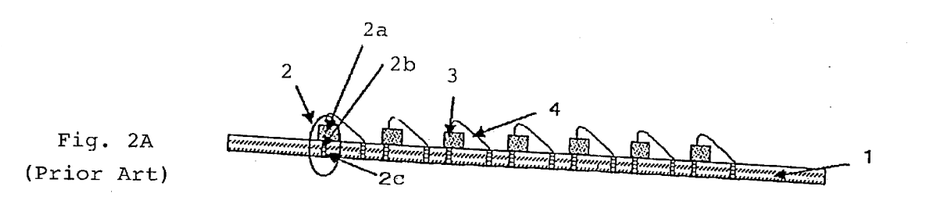
FIG. 2A to FIG. 2C are section views showing steps for manufacturing a semiconductor device in the prior art.
Figure 2B:
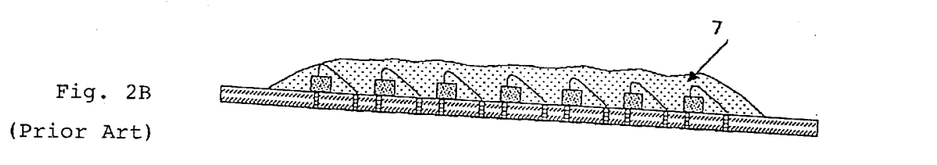
Figure 2C:
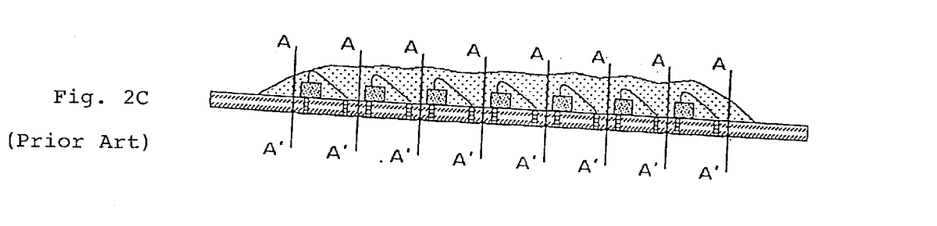

As a method of manufacturing a thin semiconductor device, a method as illustrated in FIG. 2A to FIG. 2C is conventionally employed using a substrate shown in FIG. 1A and FIG. 1B.

FIG. 1A is a top view of the substrate, and FIG. 1B and FIG. 2A to FIG. 2C are section views of the substrate taken along the C–C' line in FIG. 1A for illustrating manufacturing steps.

As shown in FIG. 1A, substrate 1 is formed of alumina ceramic and is provided with a plurality of externally guiding electrodes 2 at regular intervals. As shown in FIG. 1B, each of externally guiding electrodes 2 is configured to comprise element connecting electrode 2a, via hole 2b, and external device connecting electrode 2c such that element connecting electrode 2a on the surface is electrically connected to external device connecting electrode 2c on the back surface thorough via hole 2b.

As shown in FIG. 2A to FIG. 2C, each semiconductor device is formed by holding substrate 1 as shown in FIG. 2A to dispose and fix semiconductor element 3 onto element connecting electrode 2a with a conductive paste, an AuSn alloy, an AuSi alloy or the like, electrically connecting an electrode of fixed semiconductor element 3 to element connecting electrode 2a with wire 4 formed of gold, aluminum or the like, applying and curing liquid resin 7 with printing or application through potting (FIG. 2B), bonding the surface of the substrate on which resin 7 is cured to a tape for dicing, and cutting the substrate at A–A' planes by a dicing machine (FIG. 2C).

In the aforementioned method of manufacturing a semiconductor device, however, a reduced viscosity of resin 7 due to an increased temperature after the application thereof causes resin 7 to easily flow in the outer portions thereof, causing resin 7 to be spread without maintaining the shape at the application. As a result, the method has disadvantages that resin 7 applied at a small thickness leads to variations in thickness of applied resin 7 after the cure due to the flow of resin 7, and that semiconductor element 3 and wire 4 tend to be exposed in the portion of resin 7 with a smaller thickness.

In addition, since the alumina ceramic is used for the material of substrate 1, a smaller thickness of substrate 1 causes the concentration of mechanical stress and thermal stress in the outer portions of a substrate with many defects, easily producing cracking in the substrate.

Furthermore, since the linear expansion coefficient of a resin typically ranges from 1 to $4 \times 10^{-5}$ (/° C.) which is greatly different from that of an alumina ceramic substrate at $0.6 \times 10^{-5}$ (/° C.), cooling of resin 7 after the cure produces stress caused by the difference in the linear expansion coefficient between resin 7 and substrate 1 to readily generate a warp in the substrate. Such a warp of the substrate makes it difficult to entirely bond the adhesive tape for use in bonding to the resin applied surface of the substrate when the substrate is cut into individual semiconductor devices. Thus, disadvantages are present in which the substrate cannot be cut finely and chips are scattered from the cut product or the chips may damage and break the cutting teeth.

Prior Art

Figure 3:
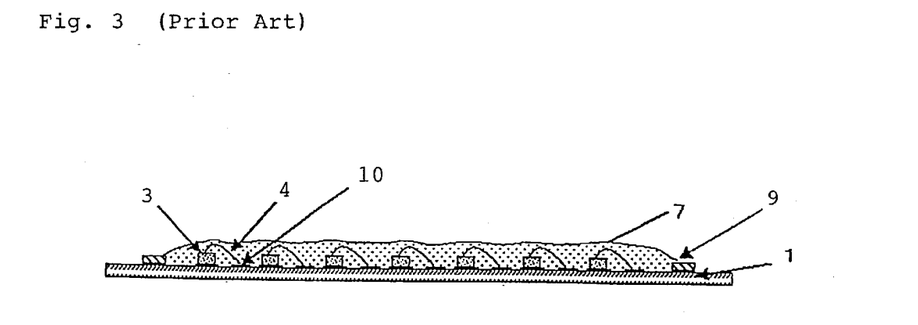
FIG. 3 is a section view of a substrate for illustrating a method of manufacturing a semiconductor device using a fluororesin frame in a prior art (Japanese Patent Laid-open Publication No.10-294498)

FIG. 3 illustrates a manufacturing method of another prior art presented in Japanese Patent Laid-open Publication No.10-294498.

The manufacturing method illustrated in FIG. 3 manufactures a semiconductor device by disposing and fixing semiconductor element 3 onto substrate 1, connecting an electrode of semiconductor element 3 to electrode 10 on substrate 1 with wire 4, attaching frame 9 formed of a fluororesin around the disposed electrodes, and applying and curing resin 7.

In such a prior art, the fluororesin is used as the material of the frame. However, its linear expansion coefficient ranges from 4 to $10 \times 10^{-5}$ (/° C.) which is greatly different from that for an alumina ceramic substrate at $0.6 \times 10^{-5}$ (/° C.), and stress is applied due to the difference in the linear expansion coefficient between frame 9 formed of the fluororesin and substrate 1.

Thus, the prior art has a disadvantage that a smaller thickness of the substrate for achieving a smaller size and a lighter weight causes a significant warp in substrate 1 due to changes in temperature after the cure of the resin, thereby impairing the adhesion between the resin surface of substrate 1 and the adhesive tape when the substrate is cut into semiconductor devices.

In addition, when frame 9 formed of the fluororesin is reduced in thickness to suppress the warp of the substrate, the resin near frame 9 formed of the fluororesin flows to readily produce variations in thickness of the resin.

Figure 4:
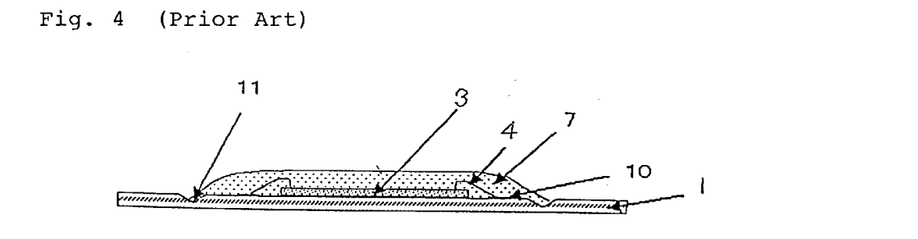
FIG. 4 is a section view of a substrate for illustrating a semiconductor device and a method of manufacturing the semiconductor device using a substrate with grooves in a prior art (Japanese Patent Laid-open Publication No.10-150127)

FIG. 4 illustrates a semiconductor device and a manufacturing method thereof of another prior art presented in Japanese Patent Laid-open Publication No.10-150127.

The manufacturing method illustrated in FIG. 4 manufactures a semiconductor device by using substrate 1 including groove 11 formed therein, disposing semiconductor element 3 on substrate 1, connecting an electrode of disposed semiconductor element 3 to electrode 10 on substrate 1 with wire 4, and then applying and curing resin 7.

In such a prior art, groove 11 formed to stop the flow of the resin causes a smaller thickness of the substrate near groove 11 to reduce the strength of the substrate near groove 11, making it easy to produce cracking in the substrate.

An additional disadvantage is that since resin 7 near groove 11 flows toward groove 11, a difference in height readily occurs after the cure between the resin near groove 11 and the resin in the central portion to result in large variations in thickness of the resin.

Figure 5:
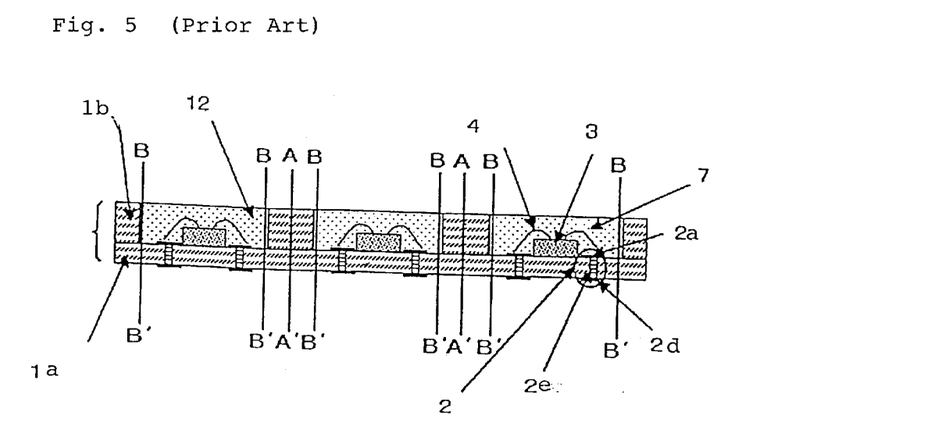
FIG. 5 is a section view of a substrate for illustrating a method of manufacturing a semiconductor device in a prior art (Japanese Patent No.2867954)

FIG. 5 illustrates a method of manufacturing a semiconductor device of another prior art presented in Japanese Patent No.2867954.

The manufacturing method in FIG. 5 manufactures a semiconductor device by using a substrate including a plurality of recesses 12 in grid form in which a plurality of element connecting electrodes 2a are connected to external device connecting electrodes 2d via through holes 2e, respectively, disposing semiconductor element 3 within each of recesses 12 in the substrate, connecting semiconductor element 3 to element connecting electrode 2a with wire 4, applying and curing resin 7, and cutting the substrate.

Such a prior art has a disadvantage that, since recess 12 has a small area, each recess 12 is likely to contain foams at the application of resin 7 which may remain as foams in the resin portion of the semiconductor device after the cure of the resin, and that large variations tend to occur in thickness of the resin since the foams escape during the cure of the resin to reduce the thickness in those portions.

When each semiconductor device is cut at the A–A' line in frame 1b, a certain width of the frame is required for the cutting, and accordingly, a smaller size of a semiconductor device is difficult to achieve.

When each semiconductor device is cut in the resin portion to avoid frame 1b (cutting at the B–B' line), the number of obtained products per substrate is reduced corresponding to frames 1b which occupy a large area in substrate 1, and additionally, many steps are required for the cutting, thereby making it difficult to reduce cost.

Furthermore, Japanese Patent Laid-open Publication No.11-67799 proposes, for "providing a method of manufacturing electronics capable of obtaining smoothness of a top surface and verticality and linearity of a side surface without loosing productivity and economy of a stencil printing and encapsulating technique," "when many electronics elements mounted on a wiring substrate for obtaining a number of products are encapsulated in a resin, first forming a dam portion along the periphery of the element mounting surface of the wiring substrate by using a dam forming resin and applying stencil printing means, next, before or after the cure of the dam portion, forming a resin layer by applying the stencil printing means in the entire area surrounded by the dam portion for encapsulating the electronics elements in their entirety, and curing the uncured dam portion and the resin layer, and then cutting and dividing the wiring substrate and the resin layer into individual electronic elements."

SUMMARY OF THE INVENTION

It is an object of the present invention to provide a semiconductor device substrate, and a method of manufacturing the substrate and a semiconductor device which remove the disadvantages possessed by the aforementioned prior art manufacturing methods and support a reduction in size and weight.

The present invention employs a semiconductor device substrate and a method of manufacturing a semiconductor device configured as follows to achieve aforementioned object.

A semiconductor device substrate according to one aspect of the present invention comprises a plurality of externally guiding electrodes for guiding electrodes of mounted semiconductor elements to the outside, respectively, and disposed at regular intervals near the center of a base formed of alumina ceramic, glass epoxy or the like, wherein the substrate is configured such that a frame formed of the same material as the base is formed in the outermost portion of the base to surround the area in which the electrodes are disposed.

A semiconductor device substrate according to another aspect of the present invention comprises a substrate including a base formed of alumina ceramic, glass epoxy or the like, and a frame formed of the same material as the base and formed in the outermost portion of the base to surround an inner area of the base, and the semiconductor device substrate further comprises, on the substrate, externally guiding electrodes, each of the electrode comprising an element connecting electrode provided at regular intervals in an area surrounded by the frame, an external device connecting electrode provided at regular intervals on the back surface of the substrate, and a via hole connecting both of the electrodes, and a plurality of semiconductor elements disposed and fixed onto the area of the base surrounded by the frame and connected to the element connecting electrodes, respectively, wherein a thermosetting resin or a thermoplastic resin is applied and cured in the area surrounded by the frame at a thickness substantially the same as the height of the frame.

A method of manufacturing a semiconductor device substrate according to the present invention comprises the steps of disposing and fixing a semiconductor element onto the area of the base surrounded by the frame in the semiconductor device substrate configured as described above, connecting the semiconductor element to the element connecting electrode, applying a thermosetting resin or a thermoplastic resin in the area surrounded by the frame at a thickness substantially the same as the height of the frame, and curing the resin.

The method of manufacturing a semiconductor device substrate preferably comprises the step of removing foams within the resin between the step of applying the resin and the step of curing the resin. In addition, the method of manufacturing a semiconductor device preferably comprises the step of applying a sheet with a softening point higher than the temperature at which the resin is cured or the temperature at which the thermoplastic resin is melted through heating and then curing the sheet, and the step of stripping off the sheet after the cure, between the step of applying the resin and the step of curing the resin.

A method of manufacturing a semiconductor device according to the present invention uses a semiconductor device substrate comprising a substrate including a base formed of alumina ceramic, glass epoxy or the like and a frame formed of the same material as the base and formed in the outermost portion of the base to surround an inner area of the base, and externally guiding electrodes, each of the electrode comprising an element connecting electrode provided at regular intervals in an area surrounded by the frame, an external device connecting electrode provided at regular intervals on the back surface of the substrate, and a via hole connecting both of the electrodes, and the method comprises the steps of disposing and fixing a semiconductor element onto the area of the base surrounded by the frame, connecting the semiconductor element to the element connecting electrode, applying and curing a thermosetting resin or a thermoplastic resin in the area surrounded by the frame at a thickness substantially the same as the height of the frame, and cutting the semiconductor device substrate into individual semiconductor devices after the resin is cured.

In the method of manufacturing a semiconductor device, the step of curing the resin is preferably performed with a sheet applied onto the resin, the sheet having a softening point higher than the temperature at which the thermosetting resin is cured or the temperature at which the thermoplastic resin is melted through heating, and the step of cutting the semiconductor device substrate into individual semiconductor devices is preferably performed after the sheet is stripped off. In addition, the method of manufacturing a semiconductor device preferably comprises the step of removing foams within the resin between the step of applying the resin and the step of curing the resin. The method of manufacturing a semiconductor device preferably comprises the step of applying a sheet with a softening point higher than the temperature at which the resin is cured or the temperature at which the thermoplastic resin is melted through heating and then curing the sheet, and the step of stripping off the sheet after the cure, between the step of applying the resin and the step of curing the resin.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Composition in Embodiment

Figure 6A:
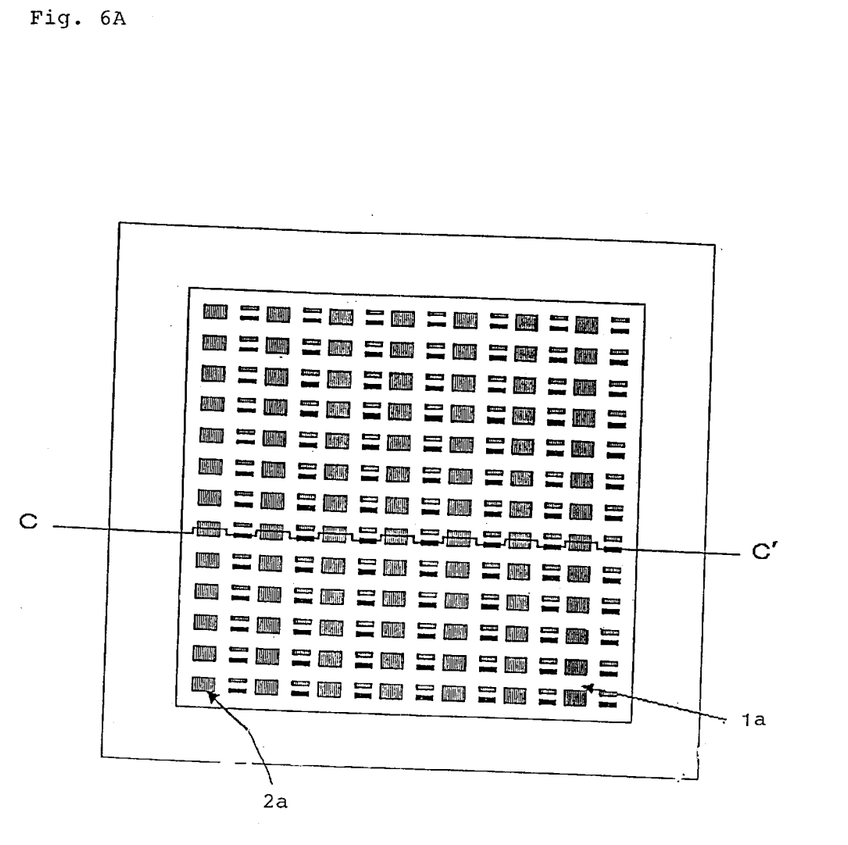
FIG. 6A and FIG. 6B are a top view and a section view of a substrate of a first embodiment according to the present invention, respectively.
Figure 6B:
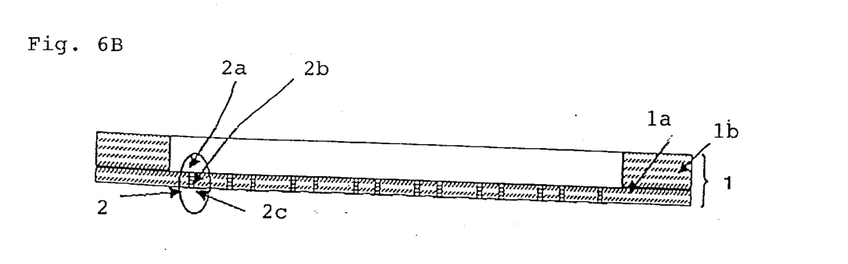

FIG. 6A and FIG. 6B are a top view and a section view of a semiconductor device substrate which is a first embodiment of the present invention, respectively. FIG. 7A to FIG. 7D are drawings for explaining steps of a method of manufacturing a semiconductor device using the semiconductor device substrate in FIG. 6A and FIG. 6B.

FIG. 6B and FIG. 7A to FIG. 7D show the substrate shown in FIG. 6A in section taken along the C–C' line.

In FIG. 6A and FIG. 6B, substrate 1 comprises base 1a and frame 1b for stopping resin flows and for adjusting resin thickness.

Base 1a is formed of alumina ceramic. A plurality of externally guiding electrodes 2 are disposed at regular intervals within the area surrounded by frame 1b formed of the same material as base 1a (alumina ceramic). As shown in FIG. 6B, each externally guiding electrode 2 is configured such that element connecting electrode 2a on the surface is electrically connected to external device connecting electrode 2c on the back surface through via hole 2b. A semiconductor element is mounted on externally guiding electrode 2.

As substrate 1, glass epoxy, glass ceramic, aluminum nitride or the like may be used as a material thereof.

Figure 7A:
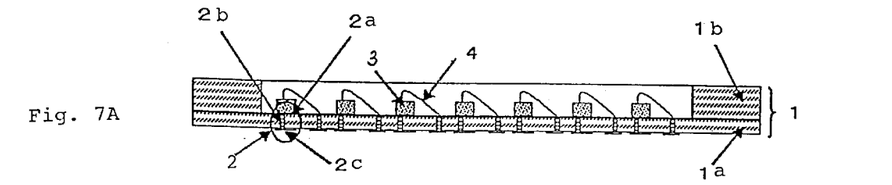
FIG. 7A to FIG. 7D are section views showing steps for manufacturing the substrate according to the present invention.

A semiconductor device is manufactured using the semiconductor device substrate shown in FIG. 6A and FIG. 6B by placing and fixing semiconductor element 3 onto element connecting electrode 2a with a conductive paste, an AuSn alloy, an AuSi alloy (not shown) or the like, and electrically connecting an electrode of fixed semiconductor element 3 to element connecting electrode 2a with wire 4 such as an Au wire, as shown in FIG. 7A.

The temperature at which semiconductor element 3 is placed and fixed is set to be higher than the melting point of an eutectic alloy, if used, by 50° C. (for example, approximately 320° C. for the AuSn alloy, or approximately 420° C. for the AuSi alloy).

When the conductive paste is used for the fixing, it is heated and cured at 150 to 200° C. for one or two hours. When Au is used for wire 4, the temperature at the connection is set to be 200 to 250° C. with ultrasonic thermal compression bonding.

Figure 7B:
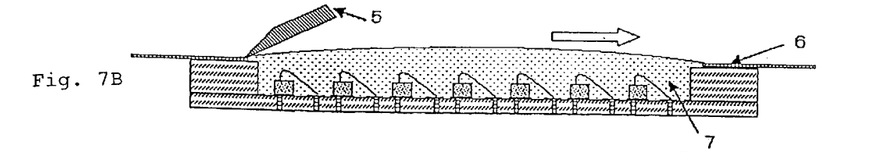

Then, as shown in FIG. 7B, mask 6 with a thickness of 150 $\mu$m or less is placed on the aforementioned substrate 1, and liquid thermosetting resin 7 is applied with printing. While the embodiment illustrates the application with printing, a thermosetting resin with a reduced viscosity may be dropped and applied to provide a thickness substantially the same as frame 1b.

Figure 7C:
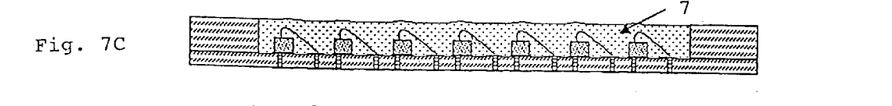

Then, substrate 1 to which resin 7 is applied shown in FIG. 7C is heated to cure resin 7.

Figure 7D:
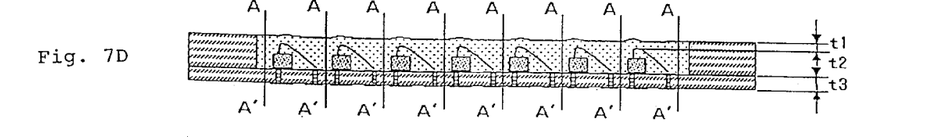

Finally, the resin applied surface of the substrate on which the resin is cured is bonded to an adhesive tape for dicing, and the substrate is cut into individual pieces with dicing along A–A' lines as shown in FIG. 7D in accordance with a recognition pattern (not shown) on the back surface of the substrate, thereby obtaining a plurality of semiconductor devices.

While description has been made with an example using the thermosetting material as resin 7, a thermoplastic resin (preferably having a softening point of 150° C. or higher) may be used and applied by heating and melting.

Description of Operations of Embodiment

As described at the outset, a thinner semiconductor device has been required.

In the semiconductor device according to the present invention shown in FIG. 7A to FIG. 7D, factors for determining the thickness of the semiconductor device are, as shown in FIG. 7D, a resin thickness t1, a height t2 of mounted parts (in this example, the sum of the heights of semiconductor element 3 and wire 4), and a substrate thickness t3. While the aforementioned factors need be minimized to provide a thinner semiconductor device, it is important to minimize the resin thickness t1 and the substrate thickness t3 for a thinner semiconductor device since the height t2 of mounted parts is determined by the mounted semiconductor element and the wire connection method (wire bonding or the like in FIG. 7A to FIG. 7D).

In the semiconductor device substrate which is the first embodiment of the present invention shown in FIG. 6A and FIG. 6B, substrate 1 is configured to provide frame 1b for stopping resin flows and for adjusting resin thickness on base 1a including a plurality of externally guiding electrodes 2 to minimize the resin thickness t1 and the substrate thickness t3.

In the semiconductor device substrate of the embodiment, frame 1b serves as a stopper for mask 6 in FIG. 7B to control the height of mask 6 for reducing variations in height, thereby allowing a reduction in the resin thickness t1.

The material of frame 1b is the alumina ceramic which is the same as base 1a to provide a structure for suppressing a warp in the substrate alone. In addition, frame 1b can reinforce the periphery of the substrate to prevent cracking in the substrate due to thermal stress from element fixing, wire connection or the like during assembly steps, and mechanical stress during holding and fixing of the substrate.

The arrangement interval pattern of the plurality of externally guiding electrodes 2 shown in FIG. 6A and FIG. 6B can be arbitrarily set in accordance with the size, the number of terminals or the like of the mounted semiconductor elements.

Next, description is made for a method of manufacturing a semiconductor device using the semiconductor device substrate in FIG. 6A and FIG. 6B with reference to FIG. 7A to FIG. 7D.

In manufacturing a semiconductor device, substrate 1 shown in FIG. 7A is held for placing and fixing semiconductor element 3, semiconductor element 3 is placed and fixed onto element connecting electrode 2a with a conductive paste, an AuSn alloy, an AuSi alloy (not shown) or the like, and an electrode of fixed semiconductor element 3 is electrically connected to element connecting electrode 2a with wire 4 such as an Au wire.

The temperature at which semiconductor element 3 is placed and fixed is set to be higher than the melting point of an eutectic alloy, if used, by 50° C. (for example, approximately 320° C. for the AuSn alloy, or approximately 420° C. for the AuSi alloy). When the conductive paste is used for the fixing, it is heated and cured at 150 to 200° C. for one or two hours. When Au is used for wire 4, the temperature at the connection is set to be 200 to 250° C. with ultrasonic thermal compression bonding.

Then, as shown in FIG. 7B, mask 6 with a thickness of 150 μm or less is placed on the aforementioned substrate 1, and liquid thermosetting resin 7 is applied with printing.

Mask 6 at a thickness of 150 μm or less can suppress the difference in height between frame 1b and resin 7 after mask 6 is removed, and can reduce variations in resin thickness due to resin flows.

While the embodiment illustrates the application with printing, a thermosetting resin with a reduced viscosity may be dropped and applied to provide a thickness substantially the same as frame 1b.

As resin 7 for use in encapsulation, it is preferable in the printing to use a thermosetting resin with a viscosity of 30 Pa·s or lower at room temperature since a higher viscosity cause a swelling in the portion of resin 7 in connection with squeegee 5 to result in a non-uniform resin thickness.

Next, the substrate shown in FIG. 7C. to which resin 7 is applied is cured with heating.

Before resin 7 is cured, form removal may be performed under a reduced pressure to remove foams contained in resin 7 after resin 7 is applied.

As an example of conditions, the foam removal is preferably performed at a pressure of 500 Pa or lower and for 5 to 10 minutes for sufficiently removing foams within resin 7.

Finally, the resin applied surface of the substrate on which the resin is cured is bonded to an adhesive tape for dicing, and the substrate is cut into individual pieces with dicing along A–A' lines as shown in FIG. 7D in accordance with a recognition pattern (not shown) on the back surface of the substrate, thereby completing the semiconductor devices.

Another Embodiment :FIG. 8A to FIG. 8D are drawings for explaining steps of a method of manufacturing a semiconductor device which is a second embodiment of the present invention.

FIG. 8A to FIG. 8D show the substrate shown in FIG. 6A in section take along the C–C' line.

The second embodiment uses the same substrate as that in the embodiment shown in FIG. 6A and FIG. 6B.

Figure 8A:
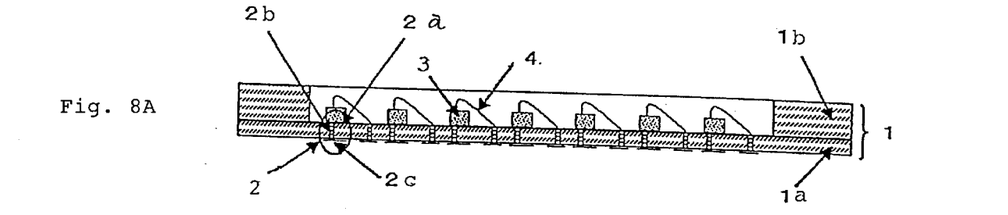
FIG. 8A to FIG. 8D are section views showing steps for manufacturing a substrate of a second embodiment according to the present invention.
Figure 8B:
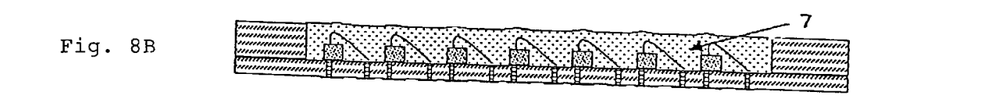

As shown in FIG. 8A to FIG. 8D, in manufacturing a semiconductor device, semiconductor element 3 is placed and fixed onto element connecting electrode 2a with a conductive paste, an AuSn alloy, an AuSi alloy (not shown) or the like as shown in FIG. 8A, and an electrode of fixed semiconductor element 3 is electrically connected to element connecting electrode 2a with wire 4 such as an Au wire. The temperature at which semiconductor element 3 is placed and fixed and the temperature at which wire 4 is connected are the same as those in the first embodiment.

Then, resin 7 is applied similarly to the first embodiment.

Figure 8C:
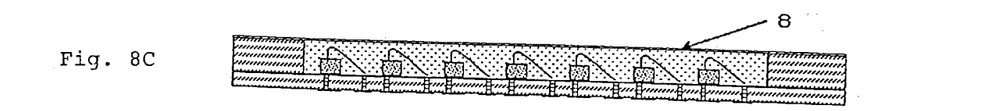

Next, as shown in FIG. 8C, heat-resistant sheet 8 with a softening point higher than the curing temperature of a thermosetting resin or the melting temperature of a heated thermoplastic resin is applied onto the substrate to which the resin is applied, and resin 8 is cured similarly to the first embodiment. Then, heat-resistant sheet 8 is stripped off from the substrate on which resin 7 is cured, a tape for dicing is bonded to the resin applied surface of the substrate, and the substrate is cut into individual pieces along A–A' lines in FIG. 8D, thereby obtaining a plurality of semiconductor devices.

When resin 7 is cured, the production of foams can be suppressed by removing foams on the same conditions as those in the first embodiment after the resin is applied and before heat-resistant sheet 8 is applied and the resin is cured. Heat-resistant sheet 8 can eliminate a slight swelling of the resin due to the surface tension of the resin near semiconductor element 3 and wire 4 shown in FIG. 8B after resin 7 is applied, thereby improving the flatness of the resin surface to allow a further reduction in variations in resin thickness.

As heat-resistant sheet 8 for use in the embodiment, a sheet in film shape with resistance to deformation is used. Such heat-resistant sheets include UPILEX 125 S which is a polyimide film made by UBE Industries, Ltd.

Figure 8D:
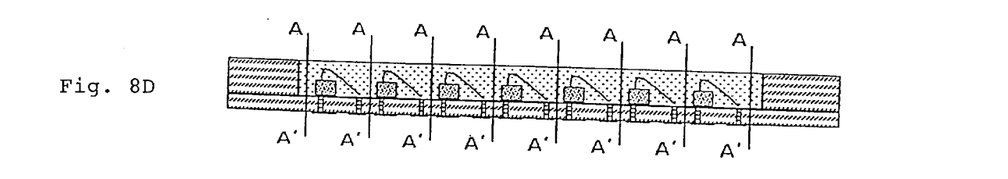
Figure 9:
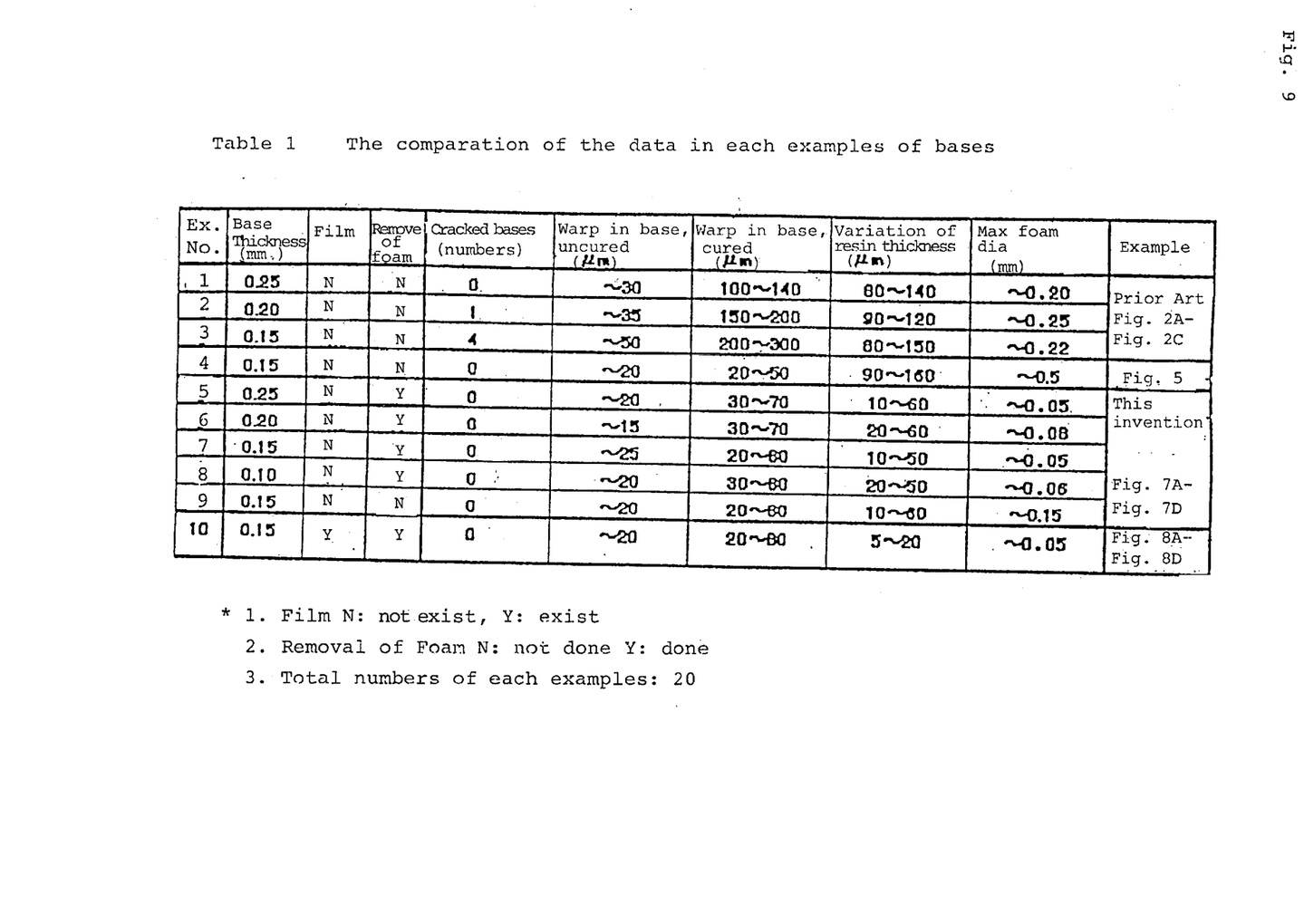
FIG. 9 is a comparison table showing data such as cracked bases, warps in base, variations of resin thickness, maximum foam diameters in the respective embodiments.

FIG. 9 shows Table 1 in which results from the manufacturing method in FIG. 8A to FIG. 8D are provided for comparison in the field of No.10.

As shown in Table 1, variations in resin thickness of the semiconductor device are 20 μm or less in No.10 for the second embodiment, which means that variations in resin thickness can be reduced as compared with the first embodiment which uses no heat-resistant sheet and represents variations of 60 μm or less in No.5 to No.9.

In addition, since almost no difference is produced in height between frame 1b and resin 7 as shown in FIG. 8D in the second embodiment, the substrate can be bonded more favorably to the adhesive tape at the cutting for dicing to result in an advantage of a long life of a cutting teeth for dicing.

Effects of the Invention

Table 1 in FIG. 9 provides the comparison results for clearly showing the difference in the effects between the embodiments of the present invention and the prior arts.

The comparison results are given in Table 1, specifically, No.1 to No.3 provide data in the prior art shown in FIG. 2A to FIG. 2C, No.4 in the other prior art in Japanese Patent No.2867954 shown in FIG. 5, and No.5 to No.9 in the semiconductor device substrate (refer to FIG. 6A and FIG. 6B) which is the first embodiment of the present invention.

The comparison data in Table 1 is obtained using a substrate 30 mm per side and frame 1b with a frame width of 3 mm and a thickness of 0.35 mm. Table 1 provides comparisons of cracked bases, warp in base with the resin uncured, warp in base with the resin cured, variations in resin thickness, and the maximum foam diameter when a semiconductor element is placed and fixed with an AuSi alloy.

As shown in Table 1, in the prior art substrate, cracked bases occur at a base thickness of 0.2 mm or less as shown in No.2 and No.3. In contrast, in the semiconductor device substrate of the present invention, no cracked base occurs even when the base thickness is reduced to 0.10 mm as shown in No. 5 to No.9.

For the warp in base with the resin uncured, a warp is increased as the base thickness is reduced in No.1 to No.3 for the prior art, while in No.5 to No.9 for the embodiment of the present invention, the warp in base with the resin uncured is substantially constant regardless of the base thickness, showing that the warp in base with the resin uncured can be reduced.

For the warp in base with the resin cured, the prior art shows warps of 100 $\mu$m or more as shown in No.1 to No.3, while the present invention can reduce the warp of the base to 80 $\mu$m or less as shown in No.5 to No.9.

In addition, for the variations in resin thickness, the prior art in No.1 to No.3 shows variations of 80 $\mu$m or more, while the embodiment of the present invention using frame 1b and mask 6 with a thickness of 150 $\mu$m or less can reduce the variations in the resin thickness to 60 $\mu$m or less as shown in No.5 to No.9.

Therefore, the resin thickness t1 can be reduced correspondingly to the reduction in the variations of resin thickness.

The field of No.9 represents data in the embodiment when foam removal is not performed before the resin is cured, and the maximum foam diameter is substantially the same as those in No.1 to No.3 for the prior art.

The fields of No.5 to No.8 show data when foam removal is performed after the resin is cured in the method of manufacturing a semiconductor device of the present invention. In this case, the production of foams can be reduced with the maximum foam diameter of 0.08 mm or less as compared with 0.15 mm in No.9 when the foam removal is not performed.

On the other hand, in the manufacturing method in Japanese Patent No.2867954 shown in FIG. 5 and in No.4, the maximum foam diameter is 0.5 mm even with the foam removal performed.

This is because a small area for filling a resin in each semiconductor device leads to insufficiency in the filling of the resin, thereby causing foams to be readily contained.

In addition, large variations in resin thickness in No. 4 also result from an unstable amount of the filled resin due to such foams.

These foams result in the exposition of internally mounted parts (such as semiconductor elements) and cause deteriorated reliability of final products. The present application can reduce the size of foams as describe before to provide a semiconductor device with high reliability.

It will be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor device substrate comprising a plurality of externally guiding electrodes to guide electrodes of mounted semiconductor elements to the outside, respectively, said guiding electrodes being disposed at regular intervals near the center of a base formed of alumina ceramic, glass epoxy or the like, wherein said substrate is configured such that a frame formed of the same material as said base is formed in the outermost portion of said base to surround the area in which said electrodes are disposed.

2. A semiconductor device substrate including a base formed of alumina ceramic, glass epoxy or the like, and a frame formed of the same material as said base and formed in the outermost portion of said base to surround an inner area of said base, said semiconductor device substrate comprising:

externally guiding electrodes, each of said electrode comprising an element connecting electrode provided at regular intervals in an area surrounded by said frame, an external device connecting electrode provided at regular intervals on the back surface of said substrate, and a via hole connecting both of said electrodes; and a plurality of semiconductor elements disposed and fixed onto said area of said base surrounded by said frame and connected to said element connecting electrodes, respectively, wherein a thermosetting resin or a thermoplastic resin is applied and cured in said area surrounded by said frame at a thickness substantially the same as the height of said frame.

* * * * *